United States Patent
Campi, Jr. et al.

(10) Patent No.: US 10,283,959 B2
(45) Date of Patent: May 7, 2019

(54) ESD STATE-CONTROLLED SEMICONDUCTOR-CONTROLLED RECTIFIER

(71) Applicant: International Business Machines Corporation, Armonk, NY (US)

(72) Inventors: John B. Campi, Jr., Westford, VT (US); Robert J. Gauthier, Jr., Hinesburg, VT (US); Rahul Mishra, Essex Junction, VT (US); Souvick Mitra, Essex Junction, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 891 days.

(21) Appl. No.: 14/449,559

(22) Filed: Aug. 1, 2014

(65) Prior Publication Data
US 2016/0036219 A1 Feb. 4, 2016

(51) Int. Cl.
*H02H 9/04* (2006.01)
*H01L 27/02* (2006.01)

(52) U.S. Cl.
CPC ......... *H02H 9/046* (2013.01); *H01L 27/0262* (2013.01)

(58) Field of Classification Search
CPC .................................. H02H 3/20; H02H 9/04
USPC .......................................................... 361/56
See application file for complete search history.

(56) References Cited

U.S. PATENT DOCUMENTS

| | | | |
|---|---|---|---|
| 5,010,380 A | 4/1991 | Avery | |
| 5,872,379 A | 2/1999 | Lee | |
| 6,573,566 B2 | 6/2003 | Ker et al. | |
| 6,825,504 B2 * | 11/2004 | Ishizuka | H01L 27/0262 257/107 |
| 7,763,940 B2 | 7/2010 | Mergens et al. | |
| 8,354,722 B2 | 1/2013 | Campi, Jr. et al. | |
| 8,634,172 B2 | 1/2014 | Campi, Jr. et al. | |
| 2002/0056876 A1 | 5/2002 | Schroeder et al. | |

(Continued)

OTHER PUBLICATIONS

M.-D. Ker et al., "On the Design of Power-Rail ESD Clamp Circuits with Gate Leakage Consideration in Nanoscale CMOS Technology," IEEE Transactions on Device and Materials Reliability, vol. 14, No. 1, 2014, pp. 536-544.

*Primary Examiner* — Dharti H Patel
(74) *Attorney, Agent, or Firm* — Scully, Scott, Murphy & Presser, P.C.; Steven J. Meyers (57) ABSTRACT

Circuits and methods of fabricating circuits that provide electrostatic discharge protection, as well as methods of protecting an integrated circuit from an electrostatic discharge event at an input/output pin. The protection circuit includes a silicon-controlled rectifier having a well and an anode in the well. The anode is coupled with the input/output pin. The protection circuit further includes a control circuit coupled with the well. The control circuit is configured to supply a first control logic voltage to the well that places the silicon-controlled rectifier in a blocking state, and a second control logic voltage to the well that places the silicon-controlled rectifier in a low impedance state. When placed in its low impedance state, the silicon-controlled rectifier is configured to divert current from the electrostatic discharge event at the input/output pin away from the integrated circuit.

15 Claims, 4 Drawing Sheets

(56) References Cited

U.S. PATENT DOCUMENTS

| | | | |
|---|---|---|---|
| 2002/0154463 A1* | 10/2002 | Mergens | H01L 27/0251 361/56 |
| 2004/0100746 A1* | 5/2004 | Chen | H01L 27/0262 361/56 |
| 2012/0099229 A1* | 4/2012 | Domanski | H01L 27/0262 361/56 |
| 2013/0050887 A1* | 2/2013 | Fan | H01L 27/0617 361/57 |
| 2013/0094113 A1 | 4/2013 | Ker et al. | |
| 2013/0200428 A1 | 8/2013 | Rountree | |
| 2014/0036398 A1 | 2/2014 | Kuznetsov | |

* cited by examiner

FIG. 4

ESD STATE-CONTROLLED SEMICONDUCTOR-CONTROLLED RECTIFIER

BACKGROUND

The invention generally relates to semiconductor manufacturing and integrated circuits and, more particularly, to circuits and methods of fabricating circuits that provide electrostatic discharge protection, as well as methods of protecting an integrated circuit from electrostatic discharge.

Electrostatic discharge (ESD) events can direct potentially large and damaging ESD currents to the sensitive integrated circuits of a chip. An ESD event involves an electrical discharge from a source, such as the human body or a metallic object, over a short duration and can deliver a large amount of current to the integrated circuit. An ESD protection circuit can be utilized to protect the integrated circuits of the chip from ESD events. During an ESD event, the ESD protection circuit triggers a shunting device, such as a silicon-controlled rectifier, to enter a low-impedance, conductive state. The ESD current is directed through the shunting device to ground and thereby diverted away from the integrated circuit. The ESD protection circuit maintains the shunting device in its conductive state until the ESD current is drained and the ESD voltage is discharged to an acceptable level.

Improved circuits and methods of fabricating circuits that provide electrostatic discharge protection, as well as improved methods of protecting an integrated circuit from electrostatic discharge, are needed.

SUMMARY

In an embodiment of the invention, a method is provided for operating a protection circuit to protect an integrated circuit from an electrostatic discharge event at an input/output pin. The method includes, when the protection circuit is powered, supplying a first control logic to a well that includes an anode of a silicon-controlled rectifier such that the silicon-controlled rectifier is placed in a blocking state. The method further includes, when the protection circuit is unpowered, supplying a second control logic to the well that places the silicon-controlled rectifier in a low impedance state.

In an embodiment of the invention, a protection circuit is provided for protecting an integrated circuit from an electrostatic discharge event at an input/output pin. The protection circuit includes a silicon-controlled rectifier having a well and an anode in the well. The anode is coupled with the input/output pin. The protection circuit further includes a control circuit coupled with the well. The control circuit is configured to supply a first control logic to the well that places the silicon-controlled rectifier in a blocking state, and a second control voltage to the well that places the silicon-controlled rectifier in a low impedance state. When placed in its low impedance state, the silicon-controlled rectifier is configured to divert current from the electrostatic discharge event at the input/output pin away from the integrated circuit.

In another embodiment of the invention, a method is provided for forming a protection circuit that protects an integrated circuit from an electrostatic discharge event at an input/output pin. The method includes forming an n-well in a substrate and an anode of a silicon controlled rectifier in the well, forming a control circuit, coupling the anode of the silicon controlled rectifier with the input/output pin, and coupling the well with an output of the control circuit.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
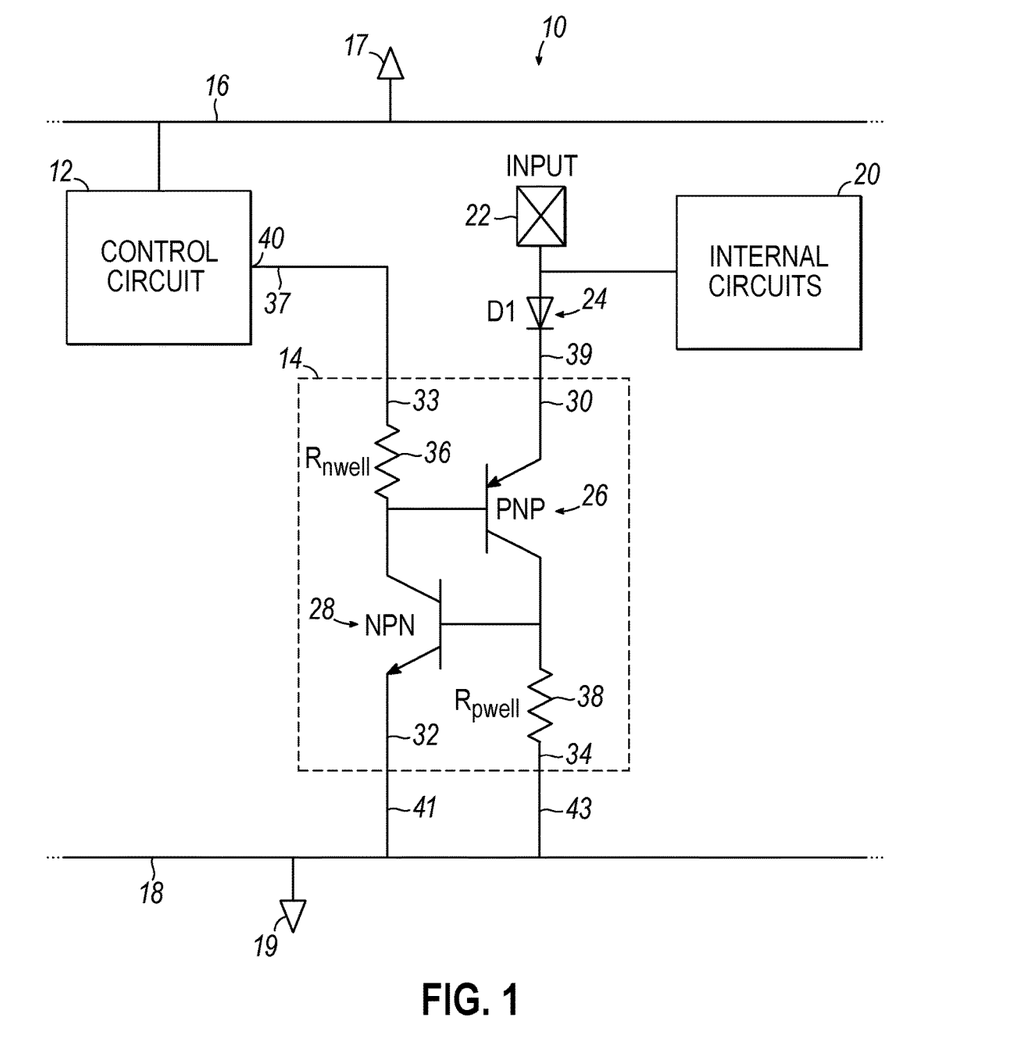
FIG. 1 is a circuit diagram for an ESD protection device with a control circuit in accordance with an embodiment of the invention.

With reference to FIG. 1 and in accordance with an embodiment of the invention, an electrostatic discharge (ESD) protection circuit 10 for a chip generally includes a control circuit 12 and a shunting device in the form of an silicon-controlled rectifier 14 coupled with the control circuit 12. The control circuit 12 is coupled between a positive power supply ($V_{DD}$) rail 16 and a negative power supply ($V_{SS}$) rail 18. The $V_{DD}$ rail 16 is connected with a $V_{DD}$ power pin 17 of the chip and the $V_{SS}$ rail 18 is connected with a $V_{SS}$ power pin 19 of the chip. The negative power supply voltage at the $V_{SS}$ rail 18 may be ground potential. Internal circuits 20 of the chip, which are protected by the ESD protection circuit 10, are also connected with the $V_{DD}$ rail 16 and $V_{SS}$ rail 18.

The silicon-controlled rectifier 14 and the internal circuits 20 are coupled with an input/output pin 22. When triggered by the control circuit 12 and clamped, the silicon-controlled rectifier 14 provides a low impedance path with a current-carrying capacity that is sufficient to dissipate the large current produced by an ESD event.

A diode 24 is coupled in series with the silicon-controlled rectifier 14 and the input/output pin 22 at a location in the ESD protection circuit 10 between the silicon-controlled rectifier 14 and the input/output pin 22. An anode of the diode 24 is coupled with the input/output pin 22 and a cathode of the diode 24 is coupled with the anode of the silicon-controlled rectifier 14. The diode 24 operates as a low-resistance ballast device to alleviate current surges at the time of power on. In an alternative embodiment, the diode 24 may be omitted from the construction of the ESD protection circuit 10. The diode 24 may be comprised of abutting regions or layers of n-type and p-type semiconductor materials formed by, for example, masked ion implantations.

The silicon-controlled rectifier 14 may be represented by a parasitic PNP bipolar transistor 26 and a parasitic NPN bipolar transistor 28 that is cross-coupled with the PNP bipolar transistor 26. The silicon-controlled rectifier 14 provides a relatively low on-resistance such that it can conduct high current at low voltages, a relatively low capacitance, and a relatively low leakage to limit power loss when the chip is powered. When the chip is powered, the silicon-controlled rectifier 14 is placed in a high-impedance state by the control circuit 12 and presents an elevated blocking voltage preventing inadvertent activation of the ESD protection circuit 10.

When the chip transitions from a powered condition to an unpowered condition, the silicon-controlled rectifier 14 is activated by the control circuit 12 with little time delay. The silicon-controlled rectifier 14 is maintained in a state of readiness to enter its low-impedance, conducting state in response to the chip being unpowered. Upon the occurrence of an ESD event, the silicon-controlled rectifier 14 provides a low-impedance ESD current discharge path from the input/output pin 22 to the ground potential at the $V_{SS}$ rail 18.

The silicon-controlled rectifier 14 may have a lateral device construction that includes doped semiconductor regions of alternating conductivity type formed in a semiconductor layer. The silicon-controlled rectifier 14 may include four doped semiconductor regions of alternating conductivity type and four electrodes or terminals, namely an anode 30, a cathode 32, an n-well contact 33, and a p-well contact 34, that are distributed among its doped semiconductor regions. In particular, one of the doped semiconductor regions may represent the anode 30 of the silicon-controlled rectifier 14, and another of the doped semiconductor regions of opposite conductivity type may represent the cathode 32 of the silicon-controlled rectifier 14. The PNP bipolar transistor 26, which includes the anode 30, is located in an n-well 36 formed in the semiconductor layer. The NPN bipolar transistor 28, which includes the cathode 32, is located in a p-well 38 formed in the semiconductor layer.

The n-well 36 is comprised of a region of the semiconductor layer doped with a dopant, such as phosphorus (P), arsenic (As), antimony (Sb), or other available n-type dopant, in order to impart n-type conductivity to the semiconductor material. The n-well 36 may be formed by implanting ions comprising the dopant in the presence of a patterned ion-implantation mask that controls dopant introduction into the semiconductor layer during implantation. The implantation conditions (e.g., kinetic energy and dose) for forming the n-well 36 are selected to provide a desired dopant concentration (e.g., light doping) and may include multiple implantation conditions. After ion implantation is complete, the ion-implantation mask is removed by, for example, oxygen plasma ashing or wet chemical stripping.

The p-well 38 is comprised of a region of the semiconductor layer doped with a dopant, such as boron (B), aluminum (Al), gallium (Ga), or any other available p-type dopant, in order to impart p-type conductivity to the semiconductor material. The p-well 38 may be formed by implanting ions comprising the dopant in the presence of a patterned ion-implantation mask that controls dopant introduction into the semiconductor layer during implantation. The implantation conditions (e.g., kinetic energy and dose) for forming the p-well 38 are selected to provide a desired dopant concentration (e.g., light doping) and may include multiple implantation conditions. The p-well 38 may be formed by counterdoping a portion of the n-well 36, or vice-versa. After ion implantation is complete, the ion-implantation mask is removed by, for example, oxygen plasma ashing or wet chemical stripping.

Doped regions of alternating conductivity type are formed in the n-well 36 and p-well 38 to define the anode 30, cathode 32, n-well contact 33, and p-well contact 34 of the silicon-controlled rectifier 14. Two of the doped regions are comprised of semiconductor material of the device region doped to have n-type conductivity. One of these doped regions is located in the n-well 36 and has the same conductivity type as the n-well 36 but is more heavily doped. The other of these doped regions is located in the p-well 38 and has the opposite conductivity type from the p-well 38. This doped region operates as the cathode 32 of the silicon-controlled rectifier 14. Two of the doped regions are comprised of semiconductor material of the device region doped to have p-type conductivity. One of these doped regions is located in the p-well 38 and has the same conductivity type as the p-well 38 but is more heavily doped. The other of these doped regions is located in the n-well 36 and has the opposite conductivity type from the n-well 36. This doped region operates as the anode 30 of the silicon-controlled rectifier 14. Each set of doped regions may be formed with an ion implantation process using a patterned mask, and the implantation conditions may be selected to provide a desired dopant concentration.

The control circuit 12 has an output 40 that is coupled with the n-well contact 33 to the n-well 36. The control circuit 12 is configured to provide state control of the n-well 36 of the silicon-controlled rectifier 14 by supplying a logic 1 at the output 40 so that the n-well 36 is either biased at $V_{DD}$ or a logic 0 at the output 40 so that the n-well 36 is grounded to $V_{SS}$. The discrete circuitry comprising the control circuit 12 may vary to provide the logic at the output 40 that supplies the state control over the n-well 36.

When the chip and ESD protection circuit 10 are powered, the control circuit 12 supplies voltage from the $V_{DD}$ rail 16 to the output 40 and, therefore, a voltage level equal to logic 1 (high or $V_{DD}$) from the $V_{DD}$ rail 16 to the n-well 36. The silicon-controlled rectifier 14 is placed in a high-impedance blocking or "off" condition, which prevents triggering and reduces leakage current while the chip is powered.

The control circuit 12 is configured to operate such that the silicon-controlled rectifier 14 is placed into a low-impedance state awaiting the occurrence of an ESD event during unpowered time periods outside of normal circuit operation. When the chip and ESD protection circuit 10 are unpowered, the control circuit 12 couples the n-well 36 with ground at the $V_{SS}$ rail 18 so that a voltage level equal to logic 0 (low or $V_{SS}$) from the $V_{SS}$ rail 18 is supplied to the n-well 36. As a result, the silicon-controlled rectifier 14 is placed in its low-impedance or "on" condition and maintained in its low-impedance condition in anticipation of a positive ESD event at the input/output pin 22.

The silicon-controlled rectifier 14 is thus turned on without time delay when the chip and ESD protection circuit 10 transition from a powered-on condition to a powered-off condition. When the ESD event occurs while the circuit is unpowered, a positive threshold voltage of approximately 0.5 volts is sufficient to trigger the NPN bipolar transistor 28 so that the ESD current is diverted by the silicon-controlled rectifier 14 away from the integrated circuits 20 and is instead conducted to ground at the $V_{SS}$ rail 18.

The lowered positive threshold voltage of 0.5 volts represents an improvement over a diode string triggered silicon-controlled rectifier (DTSCR) that include multiple diodes needed to engineer the trigger voltage. Each diode in the string contributes a positive threshold voltage of 0.5 volts to the total trigger voltage, and each diode in the string introduces leakage current. The latter may limit the use of a DTSCR to low voltage applications of less than 1.5 volts.

In use and with reference to FIG. 1, the control circuit 12 supplies a voltage level equal to logic 1 (high or $V_{DD}$) to the n-well 36 when the chip and control circuit 12 are initially powered to initiate normal circuit operation so that the silicon-controlled rectifier 14 is placed in its blocking (i.e., high impedance) condition. The optional diode 24 prevents mistriggering of the silicon-controlled rectifier 14 by current surges at the time of power on. The control circuit 12 persistently couples the n-well 36 with the $V_{DD}$ rail 16 during normal circuit operation so that the silicon-controlled rectifier 14 is maintained in its blocking condition. The reverse bias applied to the junction between the n-well 36 and anode 30 effectively isolates the input/output pin 22 from the silicon-controlled rectifier 14. In its quiescent state, the silicon-controlled rectifier 14 restricts current conduction to any leakage current that may be present.

At the time of power off, the control circuit 12 connects the n-well 36 with a voltage level equal to logic 0 (low or $V_{SS}$) so that the silicon-controlled rectifier 14 is concurrently placed into its low-impedance condition and maintained in its low-impedance condition in anticipation of a positive ESD event at the input/output pin 22. Consequently, when the chip is not powered, the silicon-controlled rectifier 14 can be activated by a positive ESD event occurring at the input/output pin 22. The turn-on voltage of silicon-controlled rectifier 14 at the time of the ESD event may be less than 0.6 volts. In its low impedance condition, the silicon-controlled rectifier 14 provides a current path for a duration sufficient to discharge the ESD current, thereby clamping the input/output pin 22 to the $V_{SS}$ rail 18 (i.e., to ground). The silicon-controlled rectifier 14 conducts current as long as the conducted current remains above its holding current. After the ESD event has dissipated and the conducted current drops below the holding current, one or both of the bipolar transistors 26, 28 falls into cutoff mode, which returns the silicon-controlled rectifier 14 to its condition prior to the ESD event.

Figure 2:
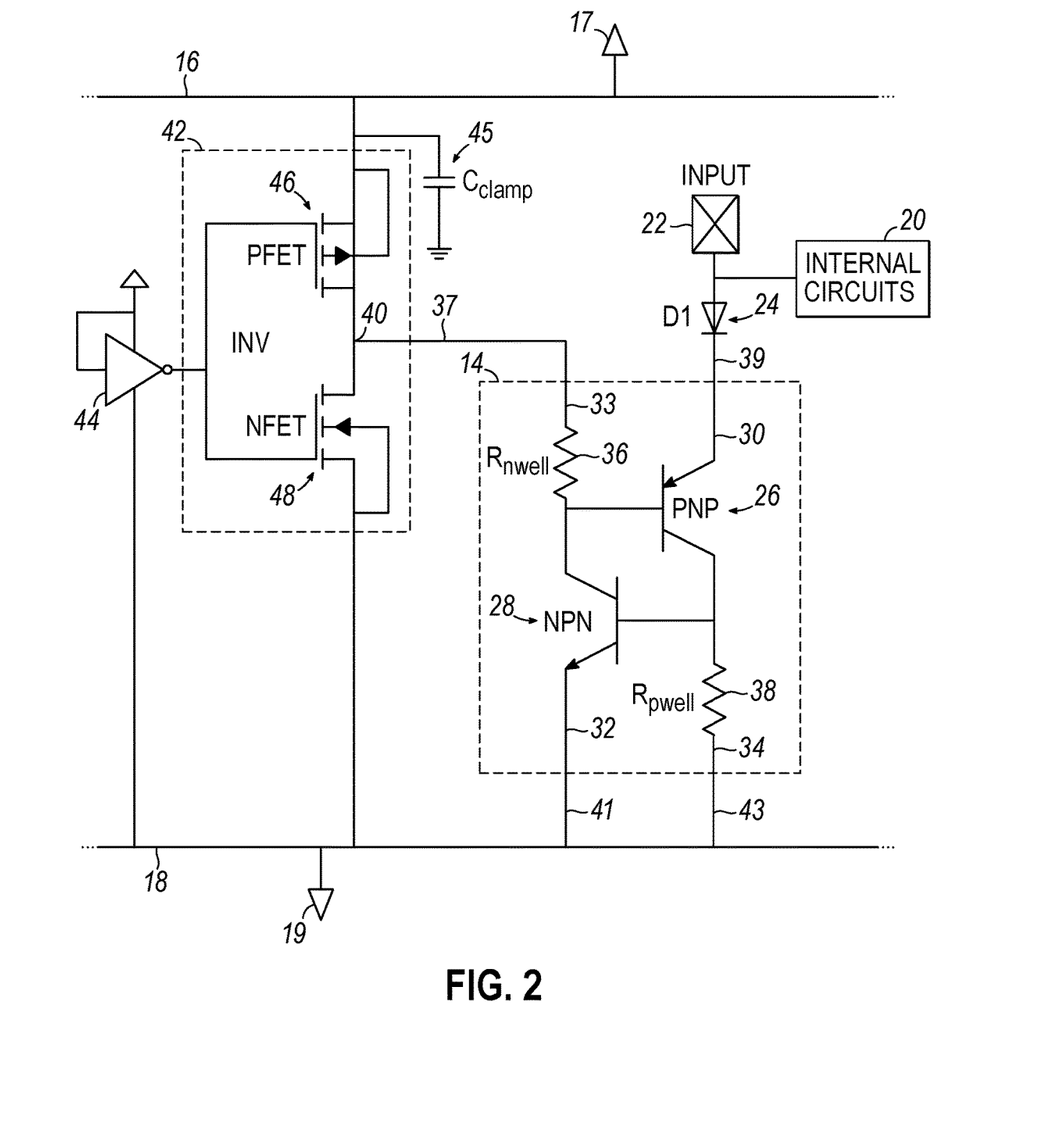
FIG. 2 is a circuit diagram similar to FIG. 1 with a control circuit in accordance with an embodiment of the invention.

With reference to FIG. 2 in which like reference numerals refer to like features in FIG. 1 and in accordance with an embodiment of the invention, the control circuit 12 may have a double-stage inverter design with an inverter 42 having the output 40 coupled with the n-well 36 and an inverter 44 having an output coupled with the input of inverter 42. The inverter 42 includes a p-channel field effect transistor (PFET) 46 and an n-channel field effect transistor (NFET) 48 that are coupled in series between the $V_{DD}$ rail 16 and the $V_{SS}$ rail 18. The gates of the field effect transistors forming the inverter 44 are coupled with the $V_{DD}$ rail 16. The inverter 44 functions to protect the gates of the PFET 46 and NFET 48 forming the inverter 42. A parasitic capacitance 45 is defined by the wiring coupling the source and body of the PFET 46 with the $V_{DD}$ rail 16, and due to any external power clamps that may exist between the $V_{DD}$ rail 16 and the $V_{SS}$ rail 18.

When the chip is powered, the input to inverter 44 is a voltage level (i.e., $V_{DD}$) equal to logic 1 (i.e., high logic) and the output from inverter 44 is a voltage level (i.e., $V_{SS}$) equal to logic 0 (i.e., low logic). The PFET 46 is placed in its low-impedance condition in response to the application of $V_{SS}$ to its gate and, as a result, inverter 42 responds by outputting a logic signal with a voltage level (i.e., $V_{DD}$) equal to logic 1 (i.e., high logic) at its output 40. As a result, the n-well 36, which is coupled with the output 40, is biased at $V_{DD}$, and the silicon-controlled rectifier 14 is placed in a blocking state.

When the chip is unpowered, the $V_{DD}$ rail 16 is logic 0 (i.e., low logic). As a result, the n-well 36 is coupled with ground at $V_{SS}$ so that the silicon-controlled rectifier 14 is concurrently placed into its low-impedance condition and maintained in its low-impedance condition in anticipation of a positive ESD event at the input/output pin 22. The silicon-controlled rectifier 14 is able to react to an ESD event at the input/output pin 22 by entering its low-impedance state with negligible time delay.

The transistors of the inverters 42, 44 may be formed on the chip by complementary metal oxide semiconductor (CMOS) processes in front end of line (FEOL) processing. Each of the field-effect transistors may includes a source in the semiconductor layer, a drain in the semiconductor layer, a gate electrode, and a gate dielectric layer positioned between the gate electrode and a region of the semiconductor layer between the source and drain that serves as a channel. The gate electrode may be comprised of a metal, a silicide, polysilicon, of combinations of these and other conductors formed by physical vapor deposition (PVD), CVD, etc. The gate dielectric layer may be comprised of a dielectric or insulating material such as silicon dioxide, silicon oxynitride, hafnium oxide, or layered combinations of these and other dielectric materials, formed by CVD, atomic layer deposition (ALD), etc. The gate dielectric layer and gate electrode may be formed from a layer stack of their constituent materials by patterning using photolithography and etching processes. The source and drain may comprise semiconductor material of the semiconductor layer that is heavily doped by masked ion implantation with either a p-type dopant or an n-type dopant depending upon the device type. A channel is defined between each source-drain pair.

An interconnect structure of the chip may be configured to communicate signals among the silicon-controlled rectifier 14, input/output pin 22, and inverters 42, 44 and to provide the power and ground connections with the $V_{DD}$ rail 16 and the $V_{SS}$ rail 18. The interconnect structure, which may be fabricated during middle-of-line (MOL) and back-end-of-line (BEOL) processing by, for example, damascene processes, includes wiring layers comprised of metal wiring embedded in dielectric layers. In particular, the output 40 of the control circuit 12, which includes inverter 42 in this embodiment, is coupled by metal wiring 37 with the n-well contact 33 to the n-well 36, the anode 30 of the silicon-controlled rectifier 14 is coupled by metal wiring 39 with the input/output pin 22, the cathode 32 of the silicon-controlled rectifier 14 is coupled by metal wiring 41 with the $V_{SS}$ rail 18, and the p-well contact 34 to the p-well 38 is coupled by metal wiring 43 with the $V_{SS}$ rail 18.

Figure 3:
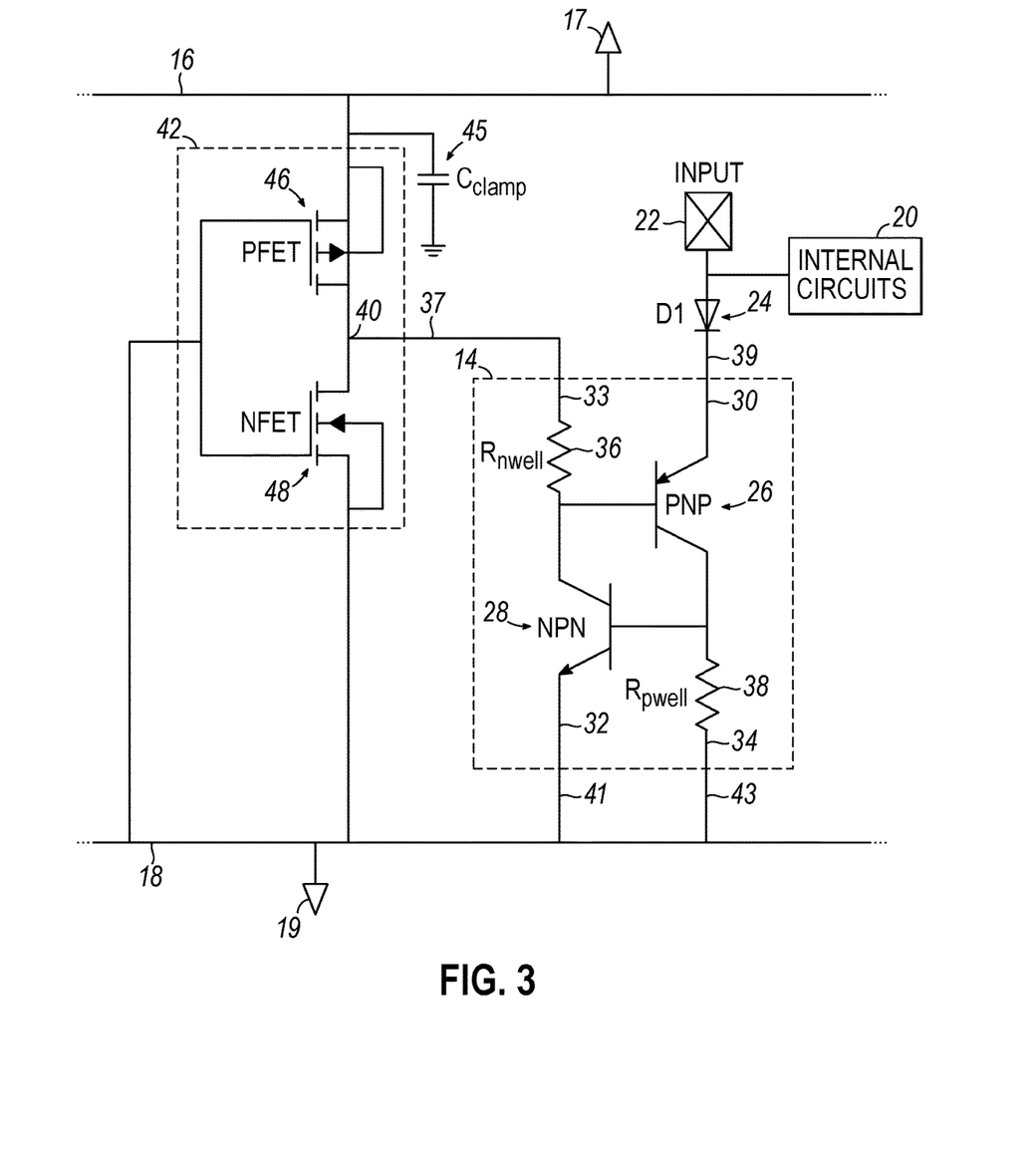
FIG. 3 is a circuit diagram similar to FIG. 2 with a control circuit in accordance with an alternative embodiment of the invention.

With reference to FIG. 3 in which like reference numerals refer to like features in FIG. 2 and in accordance with an embodiment of the invention, the control circuit 12 may have a single-stage inverter design that only includes the inverter 42. The gates of the PFET 46 and NFET 48 of the inverter 42 may be coupled with (e.g., hardwired with) the $V_{SS}$ rail 18 (i.e., ground). The hard wiring, which provides continuous grounding of the field-effect transistor gates, may be provided in the interconnect structure of the chip that is formed by middle-of-line and/or back-end-of-line processing.

Figure 4:
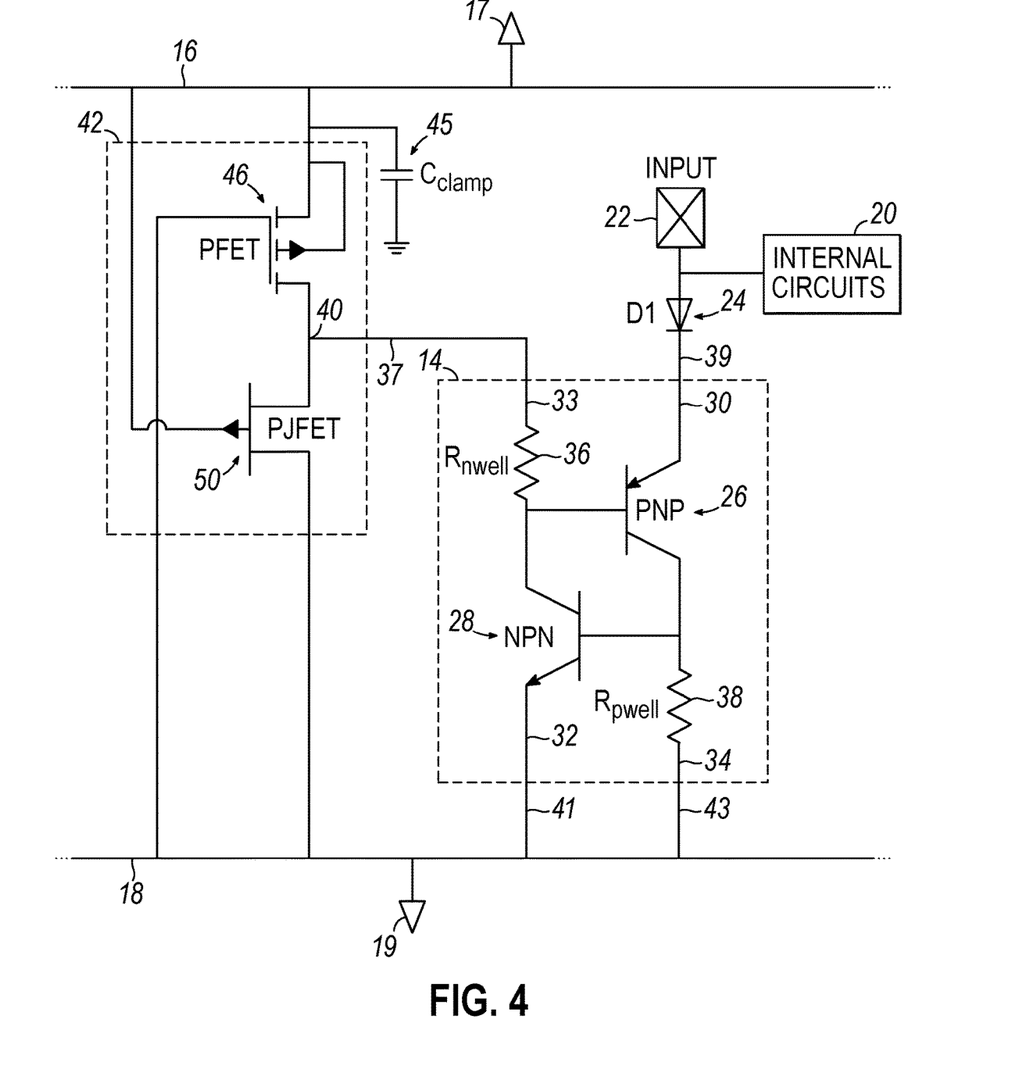
FIG. 4 is a circuit diagram similar to FIG. 2 with a control circuit in accordance with another alternative embodiment of the invention.

With reference to FIG. 4 in which like reference numerals refer to like features in FIG. 2 and in accordance with an embodiment of the invention, the control circuit 12 may include the PFET 46 and a junction field effect transistor (JFET) 50 coupled in series between the $V_{DD}$ rail 16 and the $V_{SS}$ rail 18. The output 40 at a node between the PFET 46 and the JFET 50 is coupled with the n-well 36. In one embodiment, the PFET 46 is an enhancement-mode p-channel field effect transistor and the JFET 50 is a p-channel junction field effect transistor. The JFET 50 functions as the pulldown part of the circuit and, when the circuit is powered off, will set the output 40 to a voltage level equal to logic 0 (low or $V_{SS}$) so that the n-well 36 is grounded to $V_{SS}$.

The JFET 50 includes a region of semiconductor material (e.g., silicon) of a given conductivity type defining a channel for carrier flow between a source and a drain located at opposite ends of the channel and each having heavier doping than the channel to produce a comparatively higher conductivity. A voltage applied to a gate, which is doped to have an opposite conductivity type from the channel, is used to control the flow of current from the source to the drain by varying the depth of the depletion region within the channel to provide a low impedance condition. The gate and channel define a diode structure that can be reverse biased. As the depletion region increases in volume with increasing reverse bias voltage during operation of the JFET 50, the current flowing in the channel drops and is eventually pinched-off to provide a high impedance condition. The source, drain, channel, and gate of the JFET 50 may be comprised of abutting regions or layers of n-type and p-type semiconductor materials that are formed in a semiconductor layer by ion implantation or another technique.

In one embodiment, the JFET 50 may be a p-channel junction field effect transistor and the PFET 46 may be an enhancement mode p-channel field effect transistor. A source of the JFET 50 is coupled with the $V_{SS}$ rail 18 and a drain of the JFET 50 is coupled with the n-well 36. The source of the PFET 46 is coupled with the $V_{DD}$ rail 16, the drain of the PFET 46 is coupled with the n-well 36, and the gate of the PFET 46 is coupled with the $V_{SS}$ rail 18.

The various embodiments of the invention may be implemented in bulk technologies (e.g., 200 mm and 300 mm technologies) in which the operating voltage is greater than or equal to 1.5 volts. However, implementation is also contemplated in other bulk technologies. The ability to provide an initially-on device may widen the safe ESD design window in which ESD protection can be provided as device dimensions shrink and the available range of trigger voltages likewise shrinks. The low turn-on voltage of less than 0.6 volts may be applicable to technologies with tight ESD design windows.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to or with another element, there are no intervening elements present. When an element is described as being "indirectly connected" or "indirectly coupled" to or with another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of operating a protection circuit to protect an integrated circuit from an electrostatic discharge event at an input/output pin, the method comprising:

in response to the protection circuit being powered, supplying a first control logic from a control circuit that is coupled to a well that includes an anode of a silicon-controlled rectifier such that the silicon-controlled rectifier is placed in a blocking state and the well is biased at a positive power supply ($V_{DD}$) rail, and in response to the protection circuit being unpowered, supplying a second control logic from the control circuit to the well that places the silicon-controlled rectifier in a low impedance state and the well is grounded to a negative power supply ($V_{SS}$) rail, wherein, when in the low impedance state, the silicon-controlled rectifier is configured to divert current from the electrostatic discharge event at the input/output pin away from the integrated circuit, and wherein the first control logic is logic 1 and the second control logic is logic 0, and further wherein a diode is coupled in series with the silicon-controlled rectifier and the input/output pin at a located in the protection circuit between the silicon-controlled rectifier and the input/output pin.

2. The method of claim 1 wherein the anode of the silicon-controlled rectifier is coupled directly with a cathode of the diode and an anode of the diode is coupled directly with an input-output pin, a cathode of the silicon-controlled rectifier is coupled with the negative power supply rail, and further comprising:

in response to an ESD event at the input/output pin and while the protection circuit is unpowered, directing current from the ESD event through the silicon-controlled rectifier to the negative power supply rail.

3. The method of claim 1 wherein supplying the first control logic to the well comprises:

outputting a first voltage level equal to the first control logic from a p-channel field effect transistor.

4. The method of claim 3 wherein the p-channel field effect transistor comprises part of an inverter, and supplying the second control logic to the well comprises:

supplying a second voltage level equal to the second control logic from an n-channel field effect transistor of the inverter.

5. The method of claim 3 further comprising:

outputting a second voltage level equal to the second control logic from a junction field effect transistor.

6. The method of claim 1 further comprising:

at power up, isolating the input/output pin from the silicon-controlled rectifier with the diode that is reverse biased.

7. The method of claim 1 further comprising:

when the protection circuit is unpowered, turning the silicon-controlled rectifier on at a turn-on voltage of less than 0.6 volts during the electrostatic discharge event.

8. A protection circuit for protecting an integrated circuit from an electrostatic discharge event at an input/output pin, the protection circuit comprising:

a silicon-controlled rectifier having a well and an anode in the well, the anode coupled with the input/output pin; and a control circuit coupled with the well, the control circuit configured to supply a first control logic from a positive power supply ($V_{DD}$) rail to the well that places the silicon-controlled rectifier in a blocking state and a second control logic from a negative power supply ($V_{SS}$) rail to the well that places the silicon-controlled rectifier in a low impedance state, and wherein, when in the low impedance state, the silicon-controlled rectifier is configured to divert current from the electrostatic discharge event at the input/output pin away from the integrated circuit, and wherein the first control logic is logic 1 and the second control logic is logic 0, and further wherein a diode is coupled in series with the silicon-controlled rectifier and the input/output pin at a located in the protection circuit between the silicon-controlled rectifier and the input/output pin.

9. The protection circuit of claim 8 wherein the control circuit includes a first inverter having an output coupled with the well, the first inverter including a first field effect transistor with a first gate and a second field effect transistor with a second gate.

10. The protection circuit of claim 9 wherein the control circuit further includes a second inverter coupled with the first gate and with the second gate.

11. The protection circuit of claim 9 wherein the first gate and the second gate are coupled with ground.

12. The protection circuit of claim 8 wherein the control circuit includes a field effect transistor and a junction field effect transistor.

13. The protection circuit of claim 8 wherein the diode has an anode coupled with the input/output pin and a cathode that is coupled with the anode of the silicon-controlled rectifier.

14. The protection circuit of claim 8 wherein the silicon-controlled rectifier has a turn-on voltage of less than 0.6 volts.

15. A protection circuit for protecting an integrated circuit from an electrostatic discharge event at an input/output pin, the protection circuit comprising:

a silicon-controlled rectifier having a well and an anode in the well, the anode coupled with the input/output pin; and a control circuit coupled with the well, the control circuit configured to supply a first control logic from a positive power supply ($V_{DD}$) rail to the well that places the silicon-controlled rectifier in a blocking state and a second control logic from a negative power supply ($V_{SS}$) rail to the well that places the silicon-controlled rectifier in a low impedance state, and wherein, when in the low impedance state, the silicon-controlled rectifier is configured to divert current from the electrostatic discharge event at the input/output pin away from the integrated circuit.

* * * * *